(12) United States Patent
Borden

(10) Patent No.: US 8,246,284 B2
(45) Date of Patent: Aug. 21, 2012

(54) STACKED LOAD-LOCK APPARATUS AND METHOD FOR HIGH THROUGHPUT SOLAR CELL MANUFACTURING

(75) Inventor: Peter G. Borden, San Mateo, CA (US)

(73) Assignee: Applied Materials, Inc., Santa Clara, CA (US)

( * ) Notice: Subject to any disclaimer, the term of this patent is extended or adjusted under 35 U.S.C. 154(b) by 583 days.

(21) Appl. No.: 12/398,769

(22) Filed: Mar. 5, 2009

(65) Prior Publication Data
US 2010/0226736 A1 Sep. 9, 2010

(51) Int. Cl.
*H01L 21/677* (2006.01)

(52) U.S. Cl. ........................... 414/217; 414/939

(58) Field of Classification Search ............... 414/217, 414/180, 937, 939, 935, 221; 156/345.31, 156/345.32; 141/8, 65; 454/187
See application file for complete search history.

(56) References Cited

U.S. PATENT DOCUMENTS

| | | | |
|---|---|---|---|
| 5,186,718 A | 2/1993 | Tepman et al. | |
| 5,387,067 A | 2/1995 | Grunes | |
| 5,556,248 A | 9/1996 | Grunes | |
| 5,944,049 A * | 8/1999 | Beyer et al. | 137/487.5 |
| 5,944,857 A | 8/1999 | Edwards et al. | |
| 6,034,000 A | 3/2000 | Heyder et al. | |
| 6,059,507 A * | 5/2000 | Adams | 414/217 |
| 6,382,895 B1 * | 5/2002 | Konishi et al. | 414/217 |
| 6,468,022 B1 * | 10/2002 | Whitcomb | 414/757 |
| 6,506,693 B2 | 1/2003 | Heyder et al. | |
| 6,647,665 B1 * | 11/2003 | Tabrizi et al. | 49/340 |
| 6,916,397 B2 * | 7/2005 | Pfeiffer et al. | 156/345.26 |
| 7,207,766 B2 * | 4/2007 | Kurita et al. | 414/641 |
| 7,236,229 B2 * | 6/2007 | Edo | 355/53 |
| 2006/0196422 A1 * | 9/2006 | Hiroki | 118/719 |
| 2007/0006936 A1 | 1/2007 | Hosokawa et al. | |

FOREIGN PATENT DOCUMENTS

| | | |
|---|---|---|
| JP | 2000150395 | 5/2000 |
| JP | 2008251991 | 10/2008 |

OTHER PUBLICATIONS

International Search Report and Written Opinion dated Oct. 15, 2010, 9 pgs.

* cited by examiner

*Primary Examiner* — Saul Rodriguez
*Assistant Examiner* — Glenn Myers
(74) *Attorney, Agent, or Firm* — Diehl Servilla LLC

(57) ABSTRACT

An apparatus with a plurality of load-lock chambers stacked having independently controlled pressures within their interior regions is provided. According to one or more embodiments, each load-lock chamber includes a pump valve connected to a pump line and a vent valve connected to a vent line to independently control the changes of pressure within the interior regions of the chambers. Methods for conveying substrates held within these chambers from the apparatus to one or more processing chambers, which may be in-line, are also provided.

8 Claims, 7 Drawing Sheets

STACKED LOAD-LOCK APPARATUS AND METHOD FOR HIGH THROUGHPUT SOLAR CELL MANUFACTURING

BACKGROUND OF THE INVENTION

Embodiments of the present invention generally relate to an apparatus and method for holding and conveying substrates in solar cell manufacturing processes.

Typically, a solar cell fabrication tool or apparatus requires high throughput to minimize the tool cost per watt. For example, an apparatus may run or process 1500 to 3000 wafers or substrates in one hour, with each substrate measuring approximately 156 mm on each side. To process such substrates, the apparatus must transfer the substrates from load-lock chambers, which are under vacuum conditions to a processing chamber. As used herein, the terms "load-lock" and "load-lock chamber" shall be used interchangeably and include a pressure-tight enclosure, in which the pressure in the enclosure can be reduced below atmospheric pressure.

Typical cluster tools have three chambers, which may be load-lock chambers, which are stacked on top of one another. Such tools only use one of these chamber to introduce substrates into a processing system. The remaining two chambers are used to bring substrates out of the system and to pre-heat substrates. With such tools, accessing any of the load-lock chambers releases the vacuum in all of the load-lock chambers and vacuum conditions must be resumed as soon as possible so processing can continue. After removal of the substrate, reduced pressure or vacuum conditions must be resumed and the entire chamber is pumped down. When substrates are rapidly removed, the chambers must be pumped down each time a substrate is removed. During pumping down, it is believed that throughput is limited because the pumping down process can take up to two minutes. This loss in time results in decreased efficiency and may result in up to 30 fewer substrates being processed per hour. To process as many substrates as possible, processing systems utilize rapid pumping to minimize the time lost during pumping down or forming a vacuum within the chamber.

Rapid pumping down or rapid pumping creates a number of issues. For example, thin and/or lightweight solar cells undergoing processing may shifting position in air currents or otherwise be damaged during processing. In addition, contamination in the load-lock chamber can re-deposit on the cell surface and/or water aerosols can form and deposit on substrates. To mitigate these issues, it has been found desirable to pump down at a slower rate of speed. Accordingly, there is a need for an apparatus and methods of using such apparatuses that can be used to pump down at a slower rate of speed, while maintaining a high level of efficiency to minimize tool cost per watt.

SUMMARY OF THE INVENTION

One aspect of the present invention pertains to an apparatus for use in solar cell manufacturing processes. In one or more embodiments, the apparatus is used for holding and conveying substrates to one or more processing chambers during the manufacturing process. In one or more embodiments, the apparatus includes a plurality of load-lock chambers that are stacked on top of one another.

Without being bound by theory, it is believed that that stacking multiple load-lock chambers and using an apparatus, as described herein, may allow pumping down all the load-lock chambers at a slower rate without sacrificing throughput. For example, if the pump down rate required is 25% of the rate that is possible from the apparatus, then four load-lock chambers may be stacked on one another and the apparatus can pump all of the four load-lock chambers at once at a reduced rate. Further, stacking the chambers occupies less space than conventional load-lock chambers.

According to one or more embodiments of the apparatus, the load-lock chambers have a floor area or substrate support which can simultaneously support or hold multiple substrates. Each load-lock chamber is pressure isolated from one another such that the pressure within each load-lock chamber can be independently controlled and is not dependent on changes in pressure in any of the remaining load-lock chambers. Accordingly, as the vacuum in one load-lock chamber is released to access a substrate held within, the vacuum in remaining load-lock chambers is maintained. The chamber in which the vacuum is released may be pumped down at a reduced rate and the apparatus may continue to access the remaining load-lock chambers.

In one or more embodiments, the apparatus includes at least two load-lock chambers, which may be characterized as entrance load-lock chambers capable of holding unprocessed substrates before the substrates enter one or more of the processing chambers. These chambers may also be capable of holding processed substrates after the substrates exit one or more of the processing chambers and may also be referred to as exit load-lock chambers.

Each load-lock chamber includes a front end, a back end, an interior region and a pump valve attached to a pump line to reduce gas pressure in the interior region below atmospheric pressure or to pump down the chamber. In one or more specific embodiments, each load-lock chamber is pumped down individually and, in a more specific embodiment, the each load-lock chamber is pumped down individually using a common pump and/or common pump line that is shared with one or more other load-lock chambers. In embodiments which utilize a common pump, each load-lock chamber may include a vacuum valve connected to the common pump.

In one or more embodiments, the pump valve may be staged or positioned to initially allow pressure in the interior region of each load-lock chamber to decrease slowly from atmospheric pressure to a first sub-atmospheric pressure (which may be at least $10^{-3}$ torr) and subsequently open fully to allow pressure in the interior region in each load-lock chamber to rapidly decrease from the first sub-atmospheric pressure to a second sub-atmospheric pressure, which may be less than the first sub-atmospheric pressure. Each load-lock chamber may also include a vent valve attached to a vent line to increase gas pressure in the interior region to atmospheric pressure or to maintain gas pressure in the interior region at atmospheric pressure.

Each load-lock chamber may also include one or more gate valves to enable entry of each substrate from an evacuated load-lock chamber to atmosphere and from atmosphere to a load-lock chamber. In one or more embodiments, the gate valves allow access to the interior region of each load-lock chamber when the gate valves are open. The gate valves may also provide an airtight seal on each load-lock chamber when the gate valves are closed. In a specific embodiment, a first gate valve is positioned at the front end of each load-locked chamber and a second gate valve is positioned at the back end of each load-locked chamber.

According to one or more embodiments, the apparatus may also include a transport means for moving the substrates among the processing chambers and into and out of the interior region of each load-lock chamber. In such embodiments, the transport means moves substrates into the interior region of each load-lock chamber when the second gate or the gate located at the back end of each load-lock chamber is open. The transport means may also move substrates out of the interior region of each load-lock chamber when the first gate or the gate located at the front end of each load-lock chamber valve is open. In one or more specific embodiments, the transport means may include a robot having an arm, which may include an end effector attached thereto. In a more specific embodiment, the transport means may include rollers.

The apparatus according to one or more embodiments may also include one or more processing chambers in communication with the apparatus. Examples of processing chambers include heating chambers, chemical vapor deposition chambers, pulsed-laser deposition chambers, laser annealing chambers, dry etching chambers, ion shower doping chambers, plasma deposition chambers and others known in the art.

A second aspect of the present invention pertains to a method of conveying substrates used in solar fabrication processes between an apparatus and one or more processing chambers. The method may be utilized to convey substrates between an apparatus and one or more processing chambers and may be utilized with one or more of the apparatus embodiments described herein In one or more embodiments, the method of conveying substrates includes loading one or more unprocessed substrates into separate entrance load-lock chambers and reducing the pressure in the interior region of the entrance load-lock chambers. The method may further include repeating loading the unprocessed substrates into separate entrance load-lock chambers and reducing the pressure in each entrance load-lock chamber until the first loaded unprocessed substrate is ready for processing. For example, the method may include loading a first unprocessed substrate into a first entrance load-lock chamber, reducing the pressure in the first entrance load-lock chamber, loading second unprocessed chamber into a second entrance load-lock chamber and reducing the pressure in the second load-lock chamber. This sequence may continue for additional substrates until the first and/or second unprocessed substrates are ready for processing. Thereafter, the first and second unprocessed substrates may be transferred to one or more processing chambers as they are ready for processing, with additional substrates following as they become ready for processing.

In one or more embodiments, the method includes further transferring a first unprocessed substrate from the entrance load-lock chamber to a processing chamber and may include transferring the processed substrate to a plurality of additional processing chamber. In a specific embodiment, the method also includes returning the processed substrate to an exit load-lock chamber after it has been processed by a single or plurality of additional processing chambers. Transferring and returning additional unprocessed substrates, as described, may be repeated as more substrates are loaded into entrance load-lock chambers. For example, the method may include transferring a second unprocessed substrate and/or the remaining unprocessed substrates from the entrance load-lock chamber to a first processing chamber, transferring the remaining unprocessed substrates to a plurality of processing chambers and then returning the processed substrates to one or more exit load-lock chambers.

The method of one or more embodiments further includes loading the unprocessed substrates into separate entrance load-lock chambers and reducing the pressure in each entrance load-lock chamber repeatedly until the all the unprocessed substrates have been loaded into additional entrance load-lock chambers. The method may also include transferring these unprocessed substrates from the entrance load-lock chambers to the first processing chamber to form additional processed substrates, transferring the additional processed substrates to the plurality of processing chambers and returning the additional processed substrates to additional exit load-locked chambers.

After loading one or more substrates into an entrance load-lock chamber, reducing pressure in the interior region of the entrance load-lock chamber includes partially opening the pump valve of the entrance load-lock chamber to allow pressure in the interior region thereof to slowly decrease from atmospheric pressure to first sub-atmospheric pressure and may also include fully opening the pump valve in the entrance load-lock chamber to allow the pressure in the interior region to rapidly increase from a the first sub-atmospheric pressure to a second atmospheric pressure. The method of one or more embodiments also includes closing the pump valve in the entrance load-lock chamber.

In one or more embodiments, after all of the substrates that were loaded into the entrance load-lock chambers are transferred to the first processing chamber and/or plurality of processing chambers, the method includes increasing the pressure in the interior region of the entrance load-lock chambers by opening a vent valve of the first entrance load-lock chamber to allow a flow of external air into the interior chamber until the pressure in the interior region is substantially equal to atmospheric pressure.

In one or more embodiments of the method utilize a robot to perform loading the unprocessed substrates into the entrance load-lock chambers before reducing the pressure and forming entrance load lock chambers. Such embodiments may utilize load-lock chambers having a first gate valve at a front end and a second gate valve at a back end of the load-lock chamber. In one or more specific embodiments, the robot includes an arm with an end effector attached to the arm. In such embodiments, the method includes lowering the arm of the robot such that the end effector is positioned underneath the substrate, opening the first gate valve of the entrance load-lock chamber, lifting the substrate with the end effector, placing the substrate inside the interior region of the first entrance load-lock chamber and closing the first gate valve of the first entrance load-lock chamber.

In one or more embodiments, the robot may also be utilized for transferring the unprocessed substrate from the entrance load-lock chamber to the first and/or plurality of additional processing chambers. In such embodiments, the method includes opening the second gate valve of the entrance load-lock chamber, lowering the arm of the robot so the end effector is positioned underneath the substrate, lifting the unprocessed substrate with the end effector, placing the first unprocessed substrate inside an interior region of a first processing chamber, and closing the second gate valve of the entrance load-lock chamber.

To transfer the processed substrates to the plurality of processing chambers, the method includes lowering the arm of the robot to position the end effector underneath the unprocessed substrate, lifting the first substrate with the end effector, moving the arm of the robot from the first processing chamber to the second and/or plurality of processing chambers, placing the processed substrate inside an interior region of the second and/or plurality of processing chambers. These sequences may be repeated until the first substrate has been loaded into a final processing chamber.

The method according to one or more embodiments may also utilize a robot for returning the processed substrate to an exit load-locked chamber by lowering the arm of the robot such that the end effector is positioned underneath the substrate, lifting the substrate with the end effector, moving the arm of the robot from a final processing chamber to the exit load-lock chamber, opening the first gate valve of the exit load-lock chamber, placing the substrate inside the interior region of the exit load-lock chamber and closing the first gate valve of the exit load-lock chamber. Returning the processed substrate to an exit load-lock chamber with a robot may also be repeated until the second and remaining substrates have been returned to the additional exit load-lock chambers.

A third aspect of the present invention pertains to a method of conveying substrates between an apparatus, which includes a plurality of vertically stacked load-lock chambers, and in-line processing chambers. The method may utilize load-lock chambers optionally including a vacuum valve connected to a common pump. According to one or more embodiments, the method includes loading an unprocessed substrate into an entrance load-lock chamber and reducing pressure in the interior region of the entrance load-lock chamber. The method further includes transferring the unprocessed substrate from the entrance load-lock chamber to a first processing chamber, a plurality of additional processing chambers and a final processing chamber for treatment techniques used in solar cell manufacturing and transferring the processed substrate from the final processing chamber to an exit load-lock chamber. In one or more embodiments, the method may include loading additional unprocessed substrates into an entrance load-lock chamber, transferring them to the various processing chambers and to the exit load-lock chamber until all of the unprocessed substrates have been loaded into entrance load-lock chambers, processed and transferred into exit load-lock chambers. In a specific embodiment, a roller may be utilized for transferring the unprocessed substrate to the first, plurality of additional and final processing chambers and transferring the processed substrate to an exit load-lock chamber.

In one or more embodiments of the method of conveying substrates between an apparatus and in-line processing chambers may utilize load-lock chambers with a vent valve in the interior region thereof. In such embodiments, the method further includes increasing pressure in the interior region of the first entrance load-lock chamber after all substrates located therein have been transferred to the first and/or additional processing chambers by opening the vent valve of the first entrance load-lock chamber to allow a flow of external air into the interior region until its pressure is substantially equal to atmospheric pressure.

In one or more embodiments of the method of conveying substrates between an apparatus and in-line processing chambers may utilize load-lock chambers with a pump valve in the interior region thereof. In such embodiments, after the substrate contained within the load-lock chamber is transferred to the first processing chamber, the method further includes partially opening the pump valve in the first entrance load-lock chamber to allow pressure in the interior region to slowly decrease from atmospheric pressure to a first sub-atmospheric pressure, for example, a pressure at least about $10^{-3}$ torr. In one or more specific embodiments, the method may also include fully opening the pump valve in the first entrance load-lock chamber to allow pressure in the interior region to rapidly decrease from the first sub-atmospheric pressure to a second sub-atmospheric pressure and closing the pump valve in the first entrance load-lock chamber.

The foregoing has outlined rather broadly certain features and technical advantages of the present invention. It should be appreciated by those skilled in the art that the specific embodiments disclosed may be readily utilized as a basis for modifying or designing other structures or processes within the scope present invention. It should also be realized by those skilled in the art that such equivalent constructions do not depart from the spirit and scope of the invention as set forth in the appended claims.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

According to embodiments of the invention apparatus and methods are provided that use multiple load-lock chambers that are stacked on top of one another. Each load-lock chamber includes gate valves, permitting entry and exit of substrates from atmosphere to evacuated load-lock chamber and to processing chambers under vacuum conditions. Each of the chambers may be sized to hold larger numbers of substrates. The ability to individually control load-lock conditions in each chamber permits the apparatus to pump down at a slower rate without sacrificing the load-lock conditions in the remaining chambers and without interruption or prolonged interruption to processing.

Figure 1:
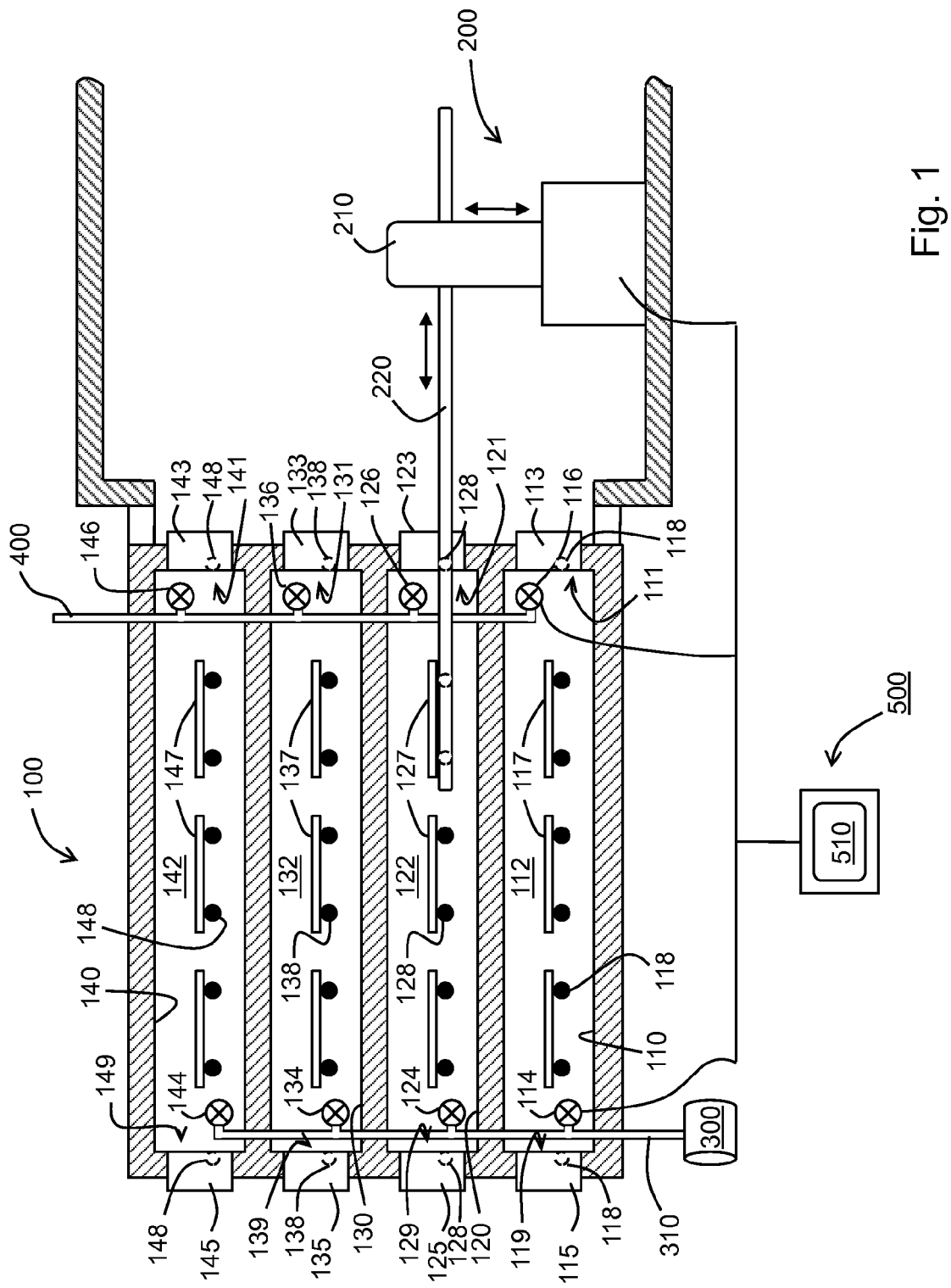
FIG. 1 illustrates a cross-sectional view of apparatus according to one embodiment of the present invention.

FIG. 1 shows a wafer processing system 100 according to one embodiment. The system 100 includes multiple chambers 110, 120, 130 and 140 arranged in a stacked configuration where the chambers are disposed on top of each other. In the embodiment shown in FIG. 1, the apparatus includes a first load-lock chamber 110, a second load-lock chamber 120, a third load-lock chamber 130 and a fourth load-lock chamber 140. The chambers are stacked on top of one another such that the fourth load-lock chamber 140 is stacked on top of a third load-lock chamber 130, which is stacked on top of a second load-lock chamber 120, which is stacked on top of a first load-lock chamber 110. Each load-lock chamber shown in FIG. 1 holds a plurality of substrates. For example, the first, second, third and fourth load-lock chambers each are shown to hold three substrates 117, 127, 137, 147 within their respective interior regions. It will be appreciated that the actual number of substrates in each load-lock chamber and/or the number of load-lock chambers will vary depending upon the particular application. The substrates may be supported on lift pins or some other suitable support to allow the substrate to be loaded and unloaded from the chambers as described further below.

One or more of the load-lock chambers may be characterized as entrance load-lock chambers and may be used for preprocessing the substrate, for example, out-gassing the substrates after the chamber has been pumped down. The load-lock chambers may have heat lamps (not shown) or hot gas inlets (not shown) for directing streams of hot gas, such as argon, onto the substrates to heat them. This is typically performed to drive out gases and moisture previously absorbed by the substrates when exposed to the atmosphere. In a specific embodiment, at least two load-lock chambers of the apparatus are entrance load-lock chambers. In one or more embodiments, load-lock chambers, which also hold processed substrates after exiting from one or more processing chambers, may also be referred to as entrance load-lock chambers and/or, in one or more specific embodiments, such load-lock chambers may be referred to as exit load-lock chambers. In FIG. 1, the second load-lock chamber 120 may be referred to as the entrance load-lock chamber.

The system 100 includes one or more transport means or tools, such as a robot 200, capable of transferring one or more substrates held in the entrance load-lock chambers to one or more processing chambers (not shown). The term "robot" includes any mechanical apparatus capable of transferring the substrates and may include a vacuum robot. Examples of processing chambers, include without limitation, heating chambers, chemical vapor deposition chambers, pulsed-laser deposition chambers, laser annealing chambers, dry etching chambers, ion shower doping chambers and other processing chambers known in the art. The robot of one or more embodiment includes an arm 210 and an end effector 220. The term "end effector" includes any structure disposed at the end of the arm and capable of lifting substrates. The arm 210 may be moveable to permit the end effector 220 to support a substrate and deposit or withdraw it from a chamber. Alternative embodiments may utilize other transport means such as rollers 118, 128, 138, 148 and other transport means known in the art.

Each load-lock chamber includes an interior region. In the load-lock chambers shown in FIG. 1, the interior region is indicated as 112, 122, 132 and 142. Each load-lock chamber also includes a pump valve 114, 124, 134, 144 attached to a pump line 310 and a pump 300. It will be understood that each pump valve may be connected to individual pump lines to a common pump or multiple pumps. In embodiments utilizing a common pump, each load-lock chamber may include a vacuum valve (not shown) connected to the common pump. Each load-lock chamber also includes a vent valve 116, 126, 136, 146, attached to a vent line 400. The pump valves reduce gas pressure in the interior region of each load-lock chamber below atmospheric pressure, while the vent valve increases gas pressure in the interior region to atmospheric pressure. As otherwise discussed herein, one or more controls (not shown), such as pressure gauges and/or preset valves, may be provided in the interior region to monitor the pressure within a chamber. In a specific embodiment, the pump valve may be staged or programmed to control the speed of pressure increases and decreases within the interior region and, optionally, may be staged or programmed to increase and/or decrease pressure to a pre-determine level of amount. For example, in a more specific embodiment, the pump valve is staged to initially open partially to allow pressure in the interior region of each load-lock chamber to slowly decrease from atmospheric pressure to a first sub-atmospheric pressure, which may be pre-determined. In an even more specific embodiment, the pump valve may further be staged to subsequently open fully to allow pressure in the interior region of the load-lock chamber to rapidly decrease from the first sub-atmospheric pressure to a second sub-atmospheric pressure, which may also be pre-determined. In one or more embodiments, the first sub-atmospheric pressure is greater than the second sub-atmospheric pressure. In a specific embodiment, the first sub-atmospheric pressure is at least about $10^{-3}$ torr.

The load-lock chambers each include one or more gate valves, which provide access to the interior region of each load-lock chamber when opened. One or more gate valves may also be present in each load-lock chamber to provide an airtight seal on each load-lock chamber, when closed. In the embodiment shown, the first load-lock chamber 110 includes a front end 111 and a first gate valve 113 is disposed at the front end 111, The first load-lock chamber 110 also includes a back end 119 with a second gate valve 115 is disposed at the back end 119. The second, third and fourth load-lock chambers 120, 130, 140 also include a front end 121, 131, 141, and a back end, 129, 139, 149, each having a first gate valve 123, 133, 143 are disposed at the front end of each load-lock chamber and a second gate valve 125, 135, 145 disposed at the back end of each load-lock chamber, respectively.

In one or more embodiments, the transport means moves one or more substrates into the interior region when the second gate valve is opened and moves one or more substrates out of the interior region when the first gate valve is opened. In a specific embodiment, the transport means moves one or more substrates into the interior region when the first gate valve is opened and out of the interior region when the second gate valve is opened. In one or more embodiments, the first and/or second gate valve of each or any of the load-lock chambers may be independently controlled from the first and second gate valves of the remaining load-lock chambers. Further, the one of the first or second gate valves of each chamber may be independently controlled from the other of the first or second gate valves.

The system 100 also includes a controller 500, which generally includes a central processing unit (CPU) 510, support circuits (not shown) and memory (not shown). The CPU 510 may be one of any form of computer processor that can be used in an industrial setting for controlling various actions and sub-processors. The memory, or computer-readable medium, may be one or more of readily available memory such as random access memory (RAM), read only memory (ROM), floppy disk, hard disk, or any other form of digital storage, local or remote, and is typically coupled to the CPU 510. The support circuits are coupled to the CPU 510 for supporting the controller 500 in a conventional manner. These circuits include cache, power supplies, clock circuits, input/output circuitry, subsystems, and the like.

The controller 500 may be connected to the pump valves 114, 124, 134, 144 of each load-lock chamber, each vent valve 116, 126, 136, 146 of each load-lock chamber and/or the robot 200. In the embodiment show, the controller 500 is connected to the pump valve 114 and vent valve 116 of the first load-lock chamber, however, one of ordinary skill in the art would recognize that each pump valve and/or vent valve may be connected to the controller 500 individually. Further, one of ordinary skill in the art would recognize that additional controls to monitor the pressure and other parameters within the interior region may also be present in each or in selected load-lock chambers, which may also be connected to the controller 500. In accordance with one or more embodiments, the additional controls may monitor pressure, temperature and/or other parameters in one load-lock chamber independently of the pressure, temperature and/or other parameters of other load-lock chambers.

Figure 2:
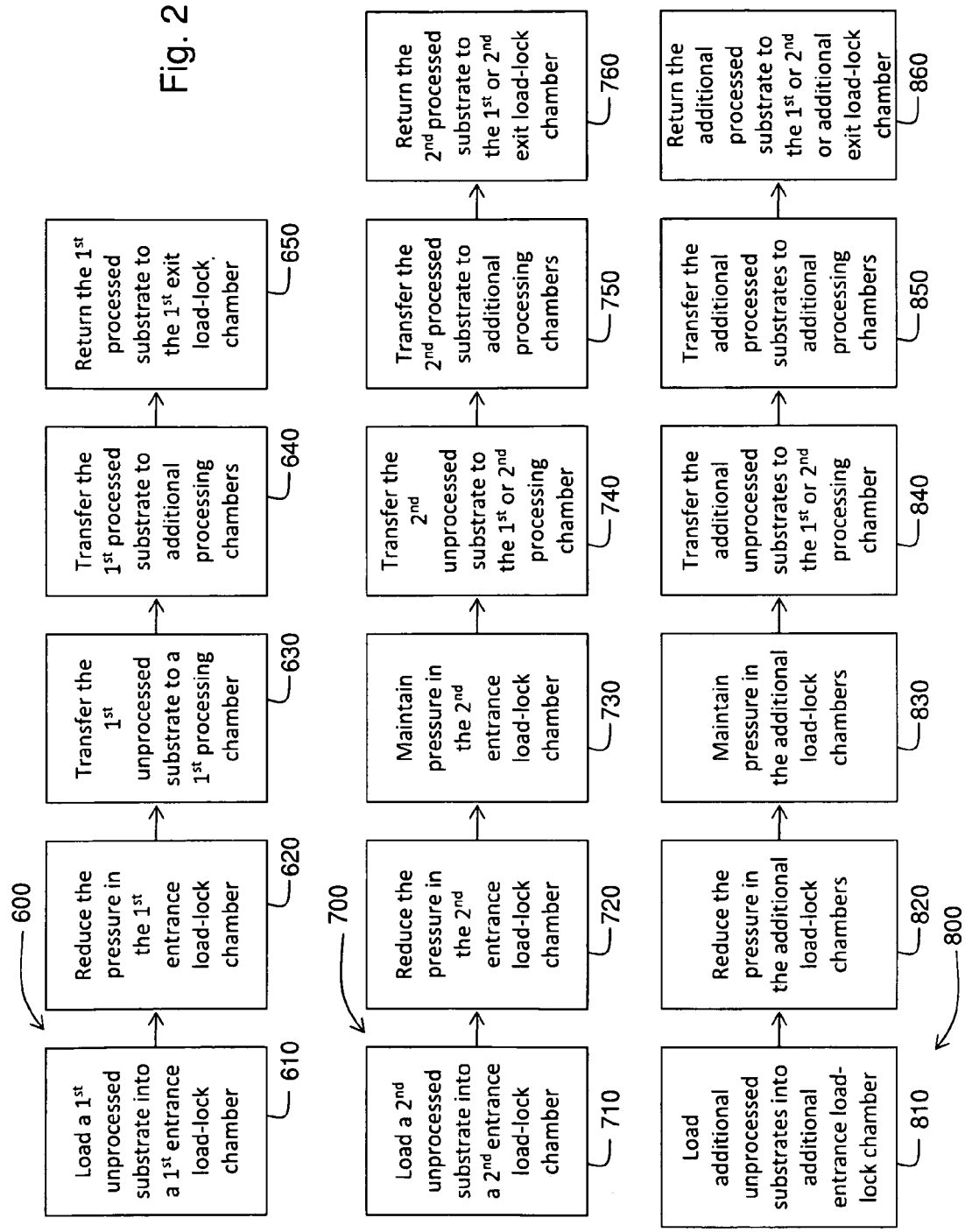
FIG. 2 illustrates a method of conveying substrates between an apparatus and processing chambers according to one embodiment.

The features of the apparatus described herein may be more readily appreciated by referring to FIG. 2, which are flow charts depicting the operation of the apparatus and an exemplary method of conveying substrates within a system. It is assumed that before start up of the system, the substrates have not yet entered the system. As shown in FIG. 2, one or more embodiments of a method of conveying substrates 600 includes 610 first loading a first unprocessed substrate into the interior region of the first entrance load-lock chamber and, thereafter, 620 reducing the pressure in the interior region of the first entrance load-lock chamber. The method further provides 710 loading a second unprocessed substrate into the interior region of a second load-lock chamber and reducing the pressure in the interior region thereof 720. In one or more embodiments, the method further includes transferring the first unprocessed substrate to a first processing chamber for treatment techniques 630, while maintaining load-lock conditions in the second entrance load-lock chamber 730, and thereafter, transferring the second unprocessed substrate to the first processing chamber or to a second processing chamber 740. In embodiments where the method includes transferring the second unprocessed substrate into the first processing chamber, the first unprocessed substrate is removed from the first processing chamber after treatment as a first processed substrate, before transferring the second unprocessed substrate into the first processing chamber.

In a specific embodiment, the method includes 640 transferring the first processed substrate to a plurality of additional processing chambers and, thereafter 650 returning the first processed substrate to an exit load-lock chamber. Similarly, in one or more embodiments, after the second unprocessed substrate is removed from the first or second processing chamber as a second processed substrate, the method includes transferring it to a plurality of additional processing chambers 750 and, thereafter, 760 returning the second processed substrate to an exit load-lock chamber.

The method shown in FIG. 2 may be repeated with each additional unprocessed substrate. For example, the method includes loading each additional unprocessed substrate into additional load-lock chambers 810 and reducing the pressure in each additional load-lock chamber 820. In a more specific embodiment, the method includes loading each additional unprocessed substrate into additional entrance load-lock chambers or either the first and/or second load-lock chambers, as the substrates held within the first and/or second load-lock chambers are transferred to the first and/or second processing chambers. In such embodiments, reducing the pressure within the interior region of the first and/or second chambers follows. In one or more embodiments, the method may includes maintaining the pressure in the additional load-lock chambers while the first and/or second unprocessed substrates are transferred to processing chambers 830. The method of one or more embodiments also includes transferring the additional unprocessed substrates to the first and/or second processing chambers 840 and, thereafter, transferring the additional substrates, which emerge from the processing chamber as additional processed substrates, to a plurality of processing chambers 850. As shown in FIG. 2, after being processed in the first, second and/or additional processing chambers, the method includes returning the additional processed substrates to one or more exit load-lock chambers 860. It will be understood that the method described in FIG. 2 can be applied to all substrates contained within a single load-lock chamber or a single processing chamber. For example, the method may include loading multiple substrates into a chamber, reducing the pressure within the chamber, transferring all of the substrates collectively to a first and additional processing chamber, and returning all of the processed substrates to an exit load-lock chamber.

As the unprocessed substrates are transferred from the entrance load-lock chambers, and further to processing chambers, the entrance load-lock chambers are empty. In one or more embodiments, the method shown in FIG. 2 is repeated and additional unprocessed substrates are loaded into the empty entrance load-lock chambers. In each instance, as an unprocessed substrate is removed, the vacuum contained within the interior chamber of the entrance load-lock chamber is released, however, the pressure within the interior region of the remaining entrance load-lock chambers is maintained. When the empty entrance load-lock chamber, which is no longer under vacuum, is loaded with a new unprocessed substrate, the pressure within the interior region is reduced or the entrance load-lock chamber may be pumped down at a slower rate. Because there is more than one entrance load-lock chamber in the system, the time required for pumping down or reducing the pressure in the chamber can be increased, and thus the pressure can be reduced at a slower rate, resulting in less damage to the substrate. For example, if there are two entrance load-lock chambers, the pump down rate can be approximately reduced by a factor of two compared when there is a single entrance load-lock chamber. If there are three or more entrance load-lock chambers, the pump down rate can be reduced by a factor of three or more, resulting in less damage to substrates in the entrance load-lock chambers. It will be understood, of course, that the actual pump down rate and pump down time will depend on the size of the load-lock chamber, and the ultimate desired pressure within the chamber.

As previously stated, the unprocessed substrates loaded within a load-lock chamber are maintained at reduced pressure, while the previously loaded substrates are transferred to the first and/or additional processing chambers and while new unprocessed substrates are loaded into the load-lock chambers. Accordingly, it is believed that rapid pumping is no longer needed and the speed at which the load-lock chambers are pump down after the unprocessed substrates are loaded, may be reduced.

Figure 3:
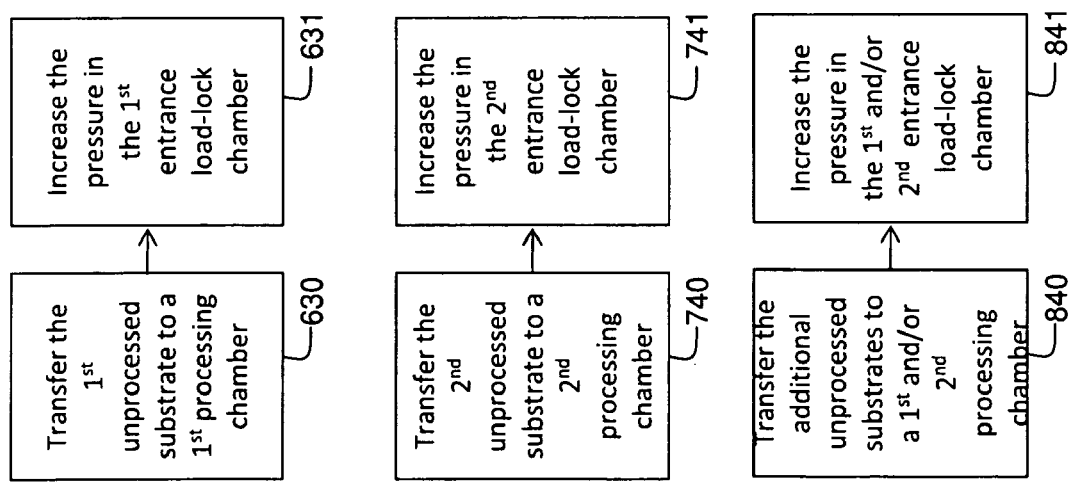
FIG. 3 further illustrates the method of FIG. 2 utilizing an apparatus that comprises a plurality of vertically stacked load-lock chambers, each containing a vent valve in its interior region.

In one or more embodiments, the method shown in FIG. 2 may be utilized with an apparatus comprising a plurality of vertically stacked load-lock chambers of the type shown in FIG. 1, each including a vent valve in its interior region, as shown FIG. 3. Referring to FIG. 3, an exemplary embodiment of the method includes increasing pressure in the interior region of the first entrance load-lock chamber after all the substrates located therein have been transferred to the first processing chamber by opening the vent valve of the first entrance load-lock chamber 631. It is understood that by opening the vent valve, a flow of external air is permitted into the interior region until the pressure in the interior region is substantially equal to atmospheric pressure. The method shown in of FIG. 3 may be applied to the second and additional entrance load-lock chambers 741, 841 after all substrates located therein have been transferred to the first processing chamber.

Figure 4:
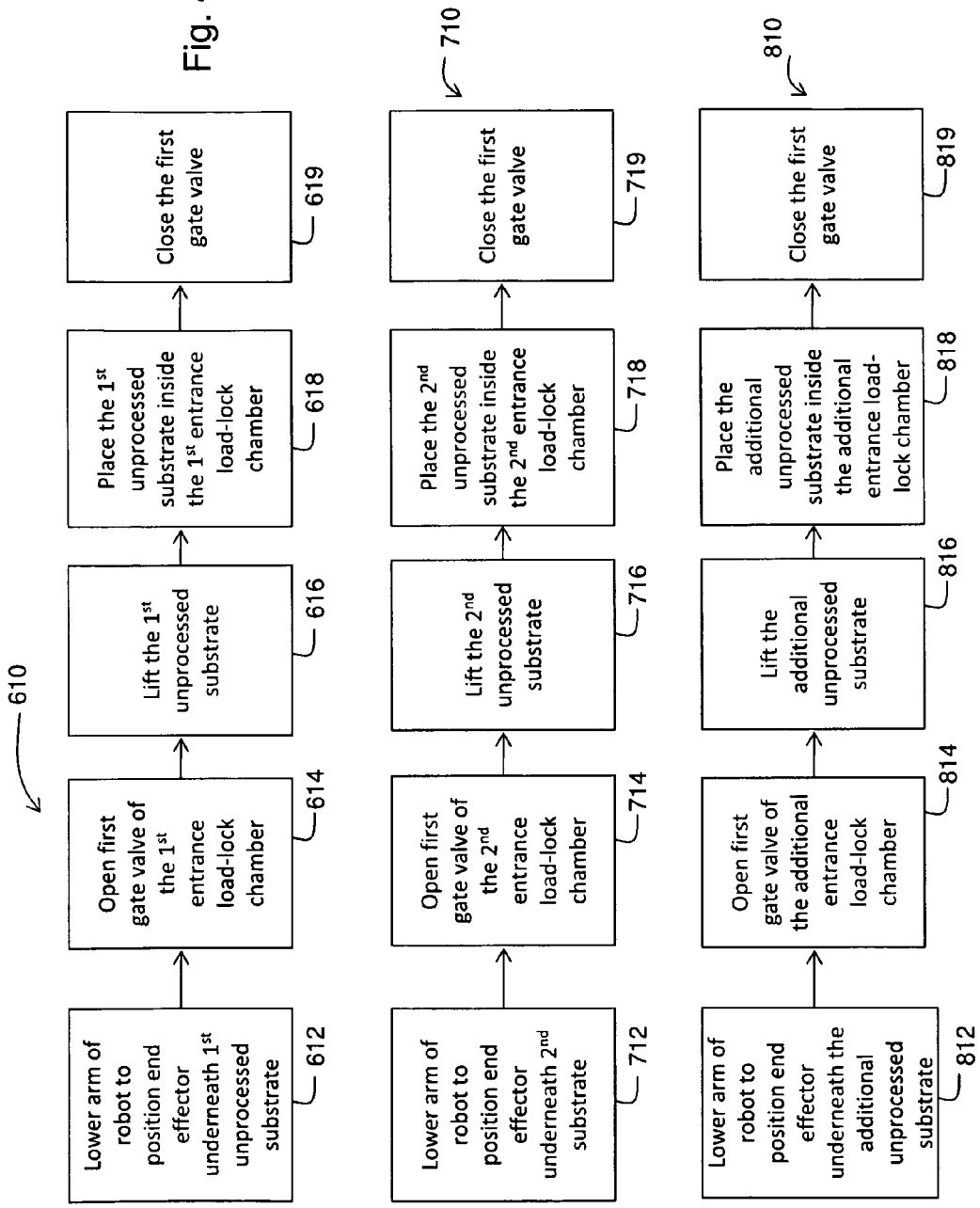
FIG. 4 further illustrates the method of FIG. 2 utilizing an apparatus comprising a robot and a first gate valve and a second gate valve at the front and back end of each load-lock chamber.
Figure 5:
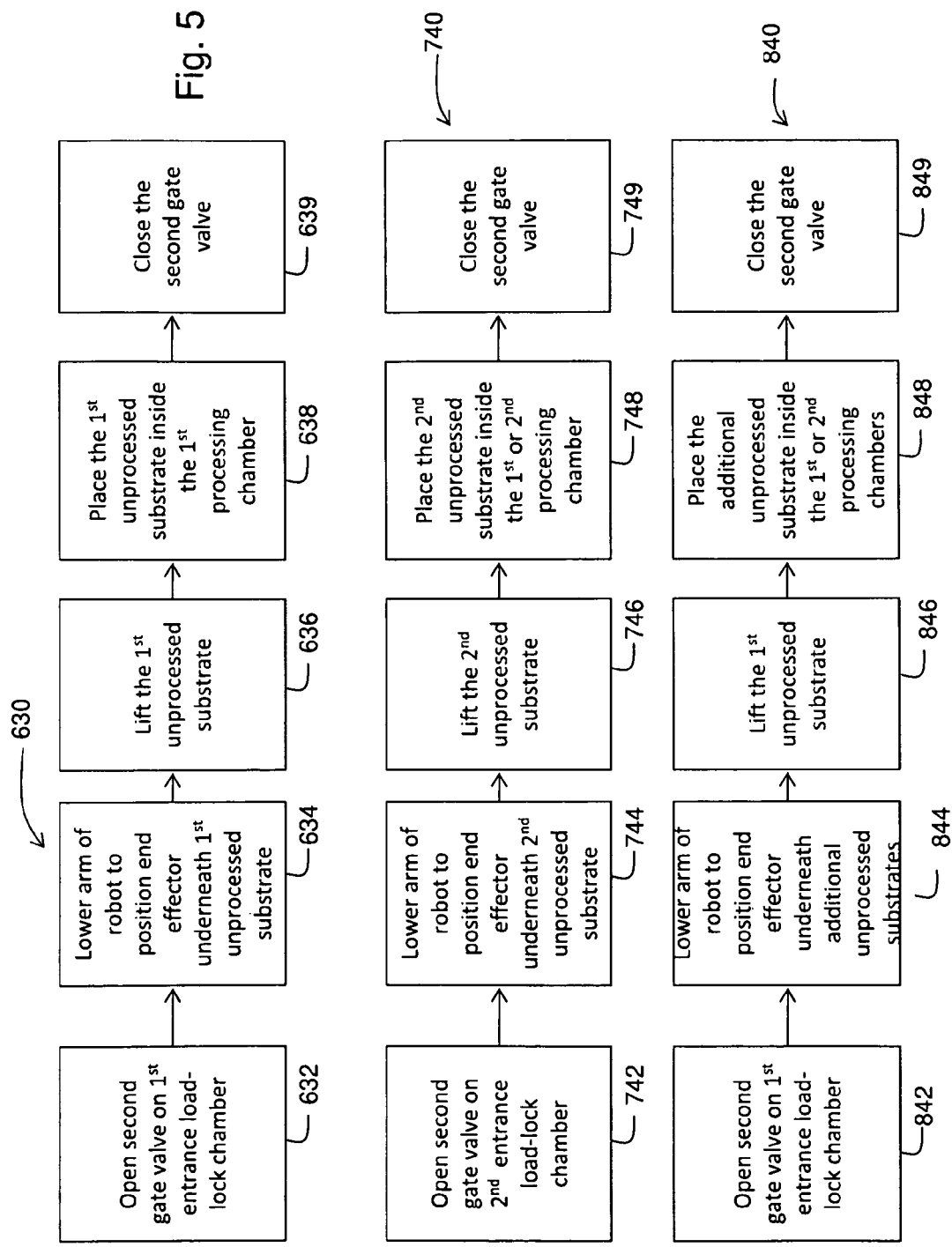
FIG. 5 further illustrates the method of FIG. 2 utilizing an apparatus with a pump valve in the interior region of each load-lock chamber.
Figure 6:
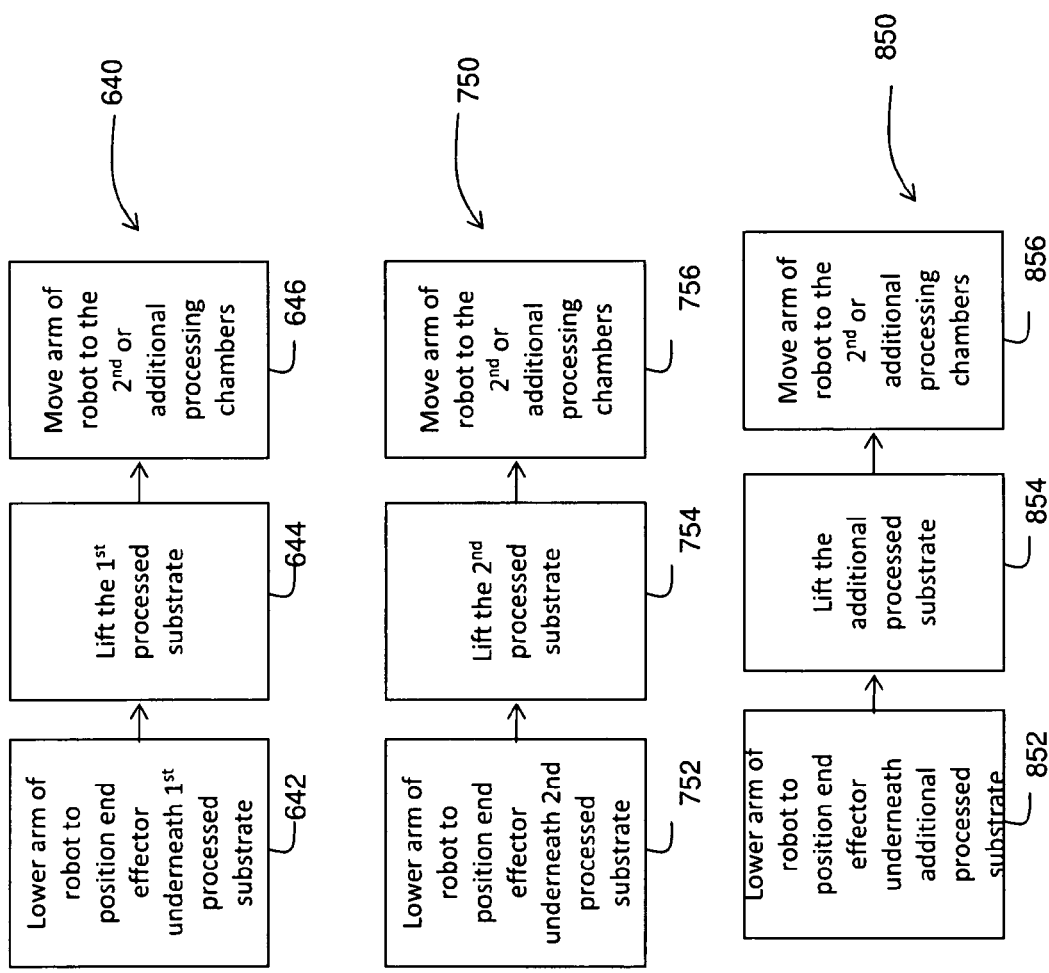
FIG. 6 illustrates the method of FIG. 2 utilizing an apparatus with a robot.

In one or more specific embodiment, the method shown FIG. 2 may utilize an apparatus with a robot and, optionally, a first and second gate valve located at the front and back end respectively, as otherwise described herein. This method is more clearly shown in FIG. 4, wherein loading a first, second and additional unprocessed substrates includes lowering the arm of the robot 612, 712 812 such that the end effector is positioned underneath the substrate. Thereafter, the method includes opening the first gate valve 614, 714, 814, lifting the substrate with the end effector 616, 716, 816, placing the substrate inside the interior region of the entrance load-lock chamber 618, 718, 818 and closing the first gate valve 619, 719, 819. After the pressure within the chamber is reduced, transferring the first, second and additional unprocessed substrates from the entrance load-lock chambers to the first and/or second processing chamber, as shown in FIG. 5, includes opening the second gate valve, lowering the arm of the robot and positioning the end effector underneath the substrate 632, 742, 842, lifting the substrate with the end effector 634, 744, 844, placing the substrate inside an interior region of the first and/or second processing chamber 638, 748, 848, and closing the second gate valve 639, 749, 849. In the embodiment shown in FIG. 6, the substrate may thereafter be transferred from the first and/or second processing chamber to the additional processing chambers by lowering the arm of the robot such that the end effector is positioned underneath the substrate 642, 752, 852, lifting the substrate with the end effector 644, 754, 854, and moving the arm of the robot from the first and/or second processing chamber to the second and/or additional processing chambers, respectively 646, 756, 856.

Figure 7:
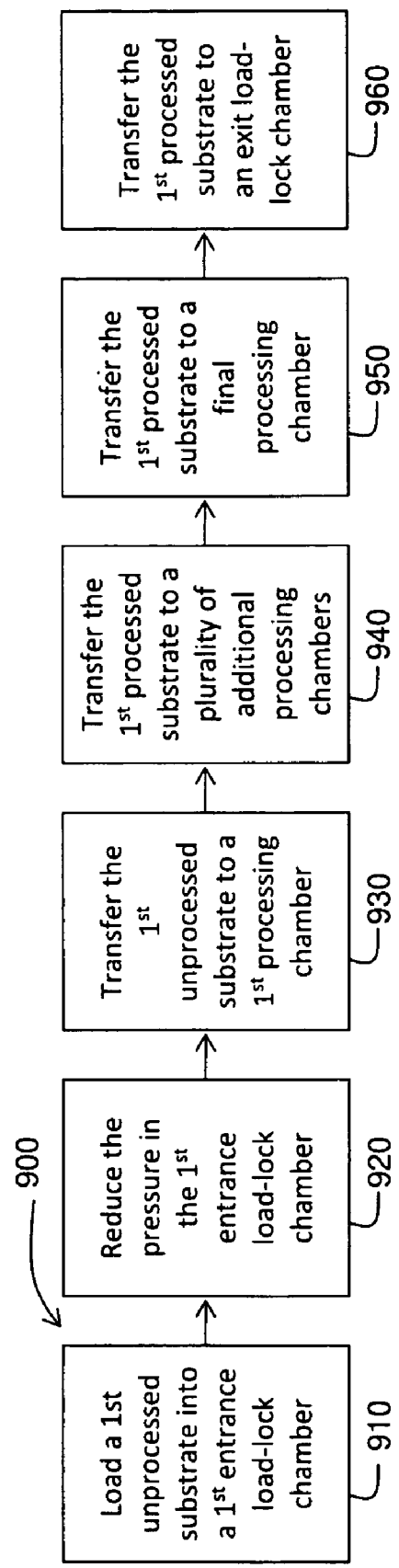
FIG. 7 illustrates a method of conveying a substrate between an apparatus and in-line processing chambers.

Another aspect of the present invention pertains to a method of conveying substrates between an apparatus and in-line processing chambers 900 as shown in FIG. 7. In one or more embodiments, the apparatus includes a plurality of vertically stacked load-lock chambers, such as the apparatus shown in FIG. 1. The method may include loading a first unprocessed substrate into a first entrance load-locked chamber 910, reducing the pressure in the interior region of the first entrance load-lock chamber 920, transferring the first substrate from the first load-lock chamber to a first processing chamber 930, a plurality of additional processing chambers 940, and a final processing chamber 950 for treatment techniques used in solar cell manufacturing. In one or more embodiments, the method further includes 960 transferring the first processed substrate from the final processing chamber to a first exit load-lock chamber. The method shown in FIG. 7 may be repeated for additional substrates using the first and additional entrance load-lock chambers and first and additional exit load-lock chambers. In such embodiments, the pressure contained within the remaining entrance load-lock chambers is controlled independently from the first entrance load-lock chambers or additional load-lock chambers from which substrates are transferred to processing chambers. In such embodiments, reducing the pressure within the interior region of the entrance load-lock chamber may be performed at a slower rate, without sacrificing the efficiency of processing substrates.

Transferring the first and additional substrates from the first load-lock chamber to the first processing chamber, the plurality of processing chamber and final processing chamber may be accomplished using rollers. Similarly, transferring the first and additional processed substrates to the first and additional exit load-lock chambers may also be accomplished using rollers.

The method 900 of FIG. 7 may be utilized with apparatus in which each load-lock chamber includes a vent valve in its interior region. In such embodiments, 910 loading the first and/or additional unprocessed substrates includes increasing the pressure of the interior region of the entrance load-lock chamber after all the substrates located therein have been transferred to the first processing chamber by opening the vent valve. As otherwise described herein, opening the vent valve allows a flow of external air into the interior region until pressure is substantially equal to atmospheric pressure.

The method 900 of FIG. 7 may also be utilized with an apparatus wherein each load-lock chamber has a pump valve in its interior region. Each load-lock chamber may optionally include a vacuum valve connected to a common pump. In one or more embodiments, reducing pressure in the interior region of the first entrance load-lock chamber includes partially opening the pump valve in the first entrance load-lock chamber to allow pressure therein to slowly decrease from atmospheric pressure to a first sub-atmospheric pressure, which may be pre-determined. In an even more specific embodiment, the method further comprises fully opening the pump valve in the first entrance load-lock chamber allow pressure in the interior region of the load-lock chamber to rapidly decrease from the first sub-atmospheric pressure to a second sub-atmospheric pressure, which may be pre-determined, and may also include closing the pump valve in the first entrance load-lock chamber. The first sub-atmospheric pressure may be greater than or less than the second sub-atmospheric pressure. In one or more embodiments, the first sub-atmospheric pressure is at least about $10^{-3}$ torr.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments. The order of description of the above method should not be considered limiting, and methods may use the described operations out of order or with omissions or additions.

It is to be understood that the above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

What is claimed is:

1. An apparatus for holding and conveying substrates used in solar cell manufacturing processes comprising:
   a plurality of load-lock chambers vertically stacked such that adjacent chambers are positioned above each other, each load-lock chamber having an interior region sized to hold multiple substrates and a pump valve attached to a pump line to reduce gas pressure in the interior region below atmospheric pressure and a vent valve attached to a vent line to increase gas pressure in the interior region to atmospheric pressure; and
   first and second gate valves allowing access to the interior region of each load-lock chamber when open and providing an airtight seal on each load-lock chamber when closed, the first gate valve positioned at a front end of each load-lock chamber and the second gate valve positioned at a back end of each load-lock chamber, wherein at least two load-lock chambers are entrance load-lock chambers to hold unprocessed substrates before they enter one or more processing chambers and to hold processed substrates after they exit from one or more processing chambers.

2. The apparatus of claim 1, further comprising transport means for moving the substrates into the interior region of each load-lock chamber, out of the interior region of each load-lock chamber, and among the processing chambers.

3. The apparatus of claim 2, wherein the transport means comprises a robot having an arm with an end effector attached thereto.

4. The apparatus of claim 2, wherein the transport means comprises rollers.

5. The apparatus of claim 1, wherein each pump valve is staged to initially open partially to allow pressure in the interior region of each load-lock chamber to slowly decrease from atmospheric pressure to a first sub-atmospheric pressure, and subsequently open fully to allow pressure in the interior region of each load-lock chamber to rapidly decrease from the first sub-atmospheric pressure to a second sub-atmospheric pressure less than the first sub-atmospheric pressure.

6. The apparatus of claim 1, further comprising one or more processing chambers in communication with the apparatus selected from the group consisting of heating chambers, chemical vapor deposition chambers, pulsed-laser deposition chambers, laser annealing chambers, dry etching chambers, and ion shower doping chambers.

7. The apparatus of claim 1, each load-lock chamber further comprising a vacuum valve connected to a common pump.

8. The apparatus of claim 5, wherein the first sub-atmospheric pressure is at least about $10^{-3}$ torr.

* * * * *